(12) United States Patent
Wang

(10) Patent No.: US 6,304,121 B1
(45) Date of Patent: Oct. 16, 2001

(54) PROCESS STRENGTH INDICATOR

(75) Inventor: Paul Peng-Sheng Wang, Dana Point, CA (US)

(73) Assignee: Entridia Corporation, Irvine, CA (US)

(*) Notice: Subject to any disclaimer, the term of this patent is extended or adjusted under 35 U.S.C. 154(b) by 0 days.

(21) Appl. No.: 09/543,404

(22) Filed: Apr. 5, 2000

(51) Int. Cl.[7] .................................................. H03K 5/12
(52) U.S. Cl. .............................................. 327/170; 327/112
(58) Field of Search .................................. 327/170, 134, 327/112, 374, 111, 378; 326/87

(56) References Cited

U.S. PATENT DOCUMENTS

| | | | |
|---|---|---|---|
| 4,795,916 | 1/1989 | Liron | 307/270 |
| 5,235,218 | 8/1993 | Matsuo et al. | 307/443 |
| 5,332,932 | 7/1994 | Runaldue | 307/443 |
| 5,457,407 | * 10/1995 | Shu et al. | 326/87 |
| 5,869,988 | 2/1999 | Jusuf et al. | 327/110 |
| 5,880,624 | 3/1999 | Koyanagi et al. | 327/541 |
| 5,887,150 | * 3/1999 | Schneider et al. | 327/170 |
| 5,917,758 | * 6/1999 | Keeth | 327/170 |
| 5,939,933 | 8/1999 | Wang | 327/512 |
| 5,966,042 | 10/1999 | Werner et al. | 327/426 |
| 6,194,913 | * 2/2001 | Verkinderen et al. | 326/87 |

* cited by examiner

*Primary Examiner*—Toan Tran
(74) *Attorney, Agent, or Firm*—Weide and Assoc.; Chad W. Miller (57) ABSTRACT

A method and apparatus for dynamically evaluating the behavior of semiconductor devices in an integrated circuit and for providing an adjusted output is disclosed. In one configuration the method and apparatus disclosed herein is configured as a compensation system and comprises a detection subsystem and a switching subsystem. The detection subsystem is configured to receive a signal generated by one or more semiconductor devices and detect the magnitude of the received signal. Depending on desired system parameters, the magnitude of the received signal causes one or more semiconductor devices to conduct an output signal to a switching subsystem. In one configuration, a plurality of signals travel from the detection subsystem to the switching subsystem. The switching subsystem is configured to receive the signal(s) from the detection subsystem and generate a voltage or current having magnitude related to the input received from the detection subsystem. In one configuration the switching subsystem comprises a plurality of devices configured to conduct current when presented with a signal from the detection subsystem. In a dynamic manner, the present invention can adapt output to compensate for changes in device behavior resulting from temperature change and variation in process parameters during manufacture. In various other embodiments, interface may be made with a processor or other control apparatus to further supplement device behavior.

18 Claims, 9 Drawing Sheets

PROCESS STRENGTH INDICATOR

FIELD OF THE INVENTION

The present invention relates to semiconductor devices and in particular to a method and apparatus to monitor and compensate for variation in device behavior.

BACKGROUND OF THE INVENTION

Modern semiconductor processing achieves millions of semiconductor devices on a single square inch of wafer. During semiconductor processing it is desirable to maintain the processing parameters generally constant to achieve a uniform process over the entire wafer. However, due to the inherent behavior of processing methods, the devices on the wafers vary in doping, size, and structure from one process run to the next. This variation is particular pronounced in short channel devices because a uniform deviation from nominal is a more significant percentage of a small device's overall channel dimension.

The variance may cause the operation of devices created during different semiconductor processing runs to differ slightly. This slight difference in behavior affects device characteristics such as current output for a particular input voltage. In terms of circuit behavior, this type of variation could have an effect on the slew rate of a circuit. For the purposes of understanding the slew rate is the rate of change at which the output of a device reacts to a change at its input.

Prior art systems operated at generally low speeds, which is to say, data was exchanged between systems at data transfer rates below those of the present invention. Low speed operation does not test the capabilities of the device and the variance in device behavior was not problematic.

In contrast to operation at generally slow speeds, operation at high speeds, i.e., a high rate of change in the signal at the input of a device, is problematic for devices that vary over process, i.e., vary in behavior from one process run to the next. For purposes of understanding, device behavior may be grouped into three categories: Fast, Normal, and Slow. In a digital environment fast devices have a larger current (Id) as compared to a slow device, which has a lower current (Id) for a particular $V_{ds}$ and $V_{gs}$ as compared to nominal. Of course, the output current of a device may assume any value between fast and slow since semiconductor processing parameters vary gradually from process to process.

Differences in device current output disrupt operation of circuits. To achieve proper operation of a semiconductor circuit at high speed, each device should have a generally uniform manner of operation. For example, in a digital environment, if a first device provides a larger current output than a second device to a generally similar input signal, then a non-uniform manner of operation can occur.

By way of example, in a digital circuit having numerous parallel output ports, it is desirable for the circuitry controlling each output port to operate at a known slew rate. Stated again, the slew rate for the purposes of understanding is the rate of change at which the output of a device reacts to a signal change at its input. If the slew rate of one or more of the output ports does not meet specifications, the circuit may not operate properly. In particular and by way of example, the PCI standard requires a particular slew rate to operate. Because the slew rate of the output circuitry is influenced by the biasing and uniformity in output of current sources that control the output driver circuitry, it is desirable to have a uniform and predictable input to the driver circuitry and for devices connected thereto to operate in a uniform manner.

Factors other than process variation result in changes in semiconductor device behavior. As a result, there is a need in the art for a method and apparatus to compensate for the effects of process parameter variation.

SUMMARY OF THE INVENTION

The present invention provides a method and apparatus to dynamically monitor device behavior and compensate in real time to changes in device voltage or current output. The present invention also provides adaption for device behavior differences resulting from process changes between device manufacturing processes by providing means to monitor the output of devices and dynamically compensate for the variation.

For purposes of understanding, the method and apparatus of the present invention may be thought of as a detection subsystem and a switching subsystem. In one embodiment the detection subsystem communicates with the switching subsystem to effectuate mutual operation. The detection subsystem receives a signal subject to variation as a result of variation of one or more devices in a circuit. In one configuration, the signal being monitored is a signal for which minimal variation is desired. Based on the magnitude of the signal, the detection subsystem enables one or more other semiconductor devices to provide one or more signals to the switching system. It is contemplated that the output of the detection subsystem may comprise a variable output having magnitude dependant on variation. It is further contemplated that the output of the detection subsystem may comprise a plurality of conductors, the number of conductors carrying a high signal being dependant on variation.

The switching subsystem obtains input from the detection subsystem. In response to the variable input, being indicative of variation, the switching subsystem generates a signal having magnitude related to the signal from the detection subsystem. In one configuration, the output of the switching subsystem serves as or is utilized as a substitute for the input signal provided to the detection subsystem. In another configuration the output of the switching subsystem is combined with the detection subsystem input to compensate, supplement or reduce the signal input to the detection subsystem.

An optional buffer subsystem may reside intermediate the detection subsystem and the switching subsystem. The buffer subsystem comprises one or more components configured to output a logical high signal if, and only if, the buffer receives a signal of adequate voltage or current at its input. In multiconductor configurations, a buffer may be associated with each conductor.

In one exemplary configuration the detection subsystem comprises a plurality of semiconductor devices manufactured under the same process as the device or devices being monitored. Because the devices of the detection subsystem are on the same integrated circuit and manufactured during the same manufacturing process as the device being monitored, these devices exhibit generally identical behavior. As a result, the one or more semiconductor devices of the detection subsystem react in a generally identical manner to variation from temperature change or from process variation during manufacture. In one configuration of a detection subsystem with multiple devices, each device comprises a field effect transistor having gate terminal connected to the input of a monitored or precision required signal. Each of the one or more transistors is configured to conduct, turn-on, or enter saturation at a different signal level. As a result, depending on the magnitude of the input signal, a varying number of transistors are on or in saturation.

In such a configuration, multiple output lines, each connected to different source terminal of a detection subsystem transistor, feed into the buffer. The buffer receives the detection circuit output on the multiple output lines and for lines having sufficient it signal level, above a trigger point, the buffer outputs of high logic level signal. For signal lines having less than the trigger point, the buffer outputs a low or zero logic level signal.

Thereafter, the buffer output feeds into the switching subsystem, which in this configuration comprises a number of transistor devices, each having its gate terminal connected to one of the output lines from the buffer. The switching system transistor devices connect via their source terminal to high logic level signals. The drain terminals of the switching system transistor devices connect to a common node or summing junction to thereby combine the output of each transistor. This combined signal serves as compensation to or replacement for the signal provided to the detection circuit and is thereby modified to provide the desired signal level. The transistor switching levels, current source characteristics, and buffer output level is preferably adjusted to satisfy the particular requirements of each configuration.

In other embodiments or configurations it is contemplated that the present invention incorporate a microprocessor or other intelligent interface. In such an embodiment, the microprocessor or other decision making device performs an analysis on the output of any of the detection subsystem, buffer subsystem, or switching subsystem to thereby optionally utilize the output of the compensation system, or some subsystem thereof or a modified version of the compensation system output. In this type of system, the processor provides another level of signal accuracy verification and signal compensation. It is contemplated that a user interface connect to the processor to facilitate user control over the process.

Further objects, features, and advantages of the present invention over the prior art will become apparent from the detailed description of the drawings which follow, when considered with the attached figures. It is contemplated that the features described herein can be combined alone or in any combination.

DETAILED DESCRIPTION OF THE INVENTION

The present invention in one configuration comprises a method and apparatus for overcoming the effects of process parameter variation in semiconductor manufacturing. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention. Moreover, each of the elements described herein may be utilized individually or combined in any and/or all combinations.

Figure 1:
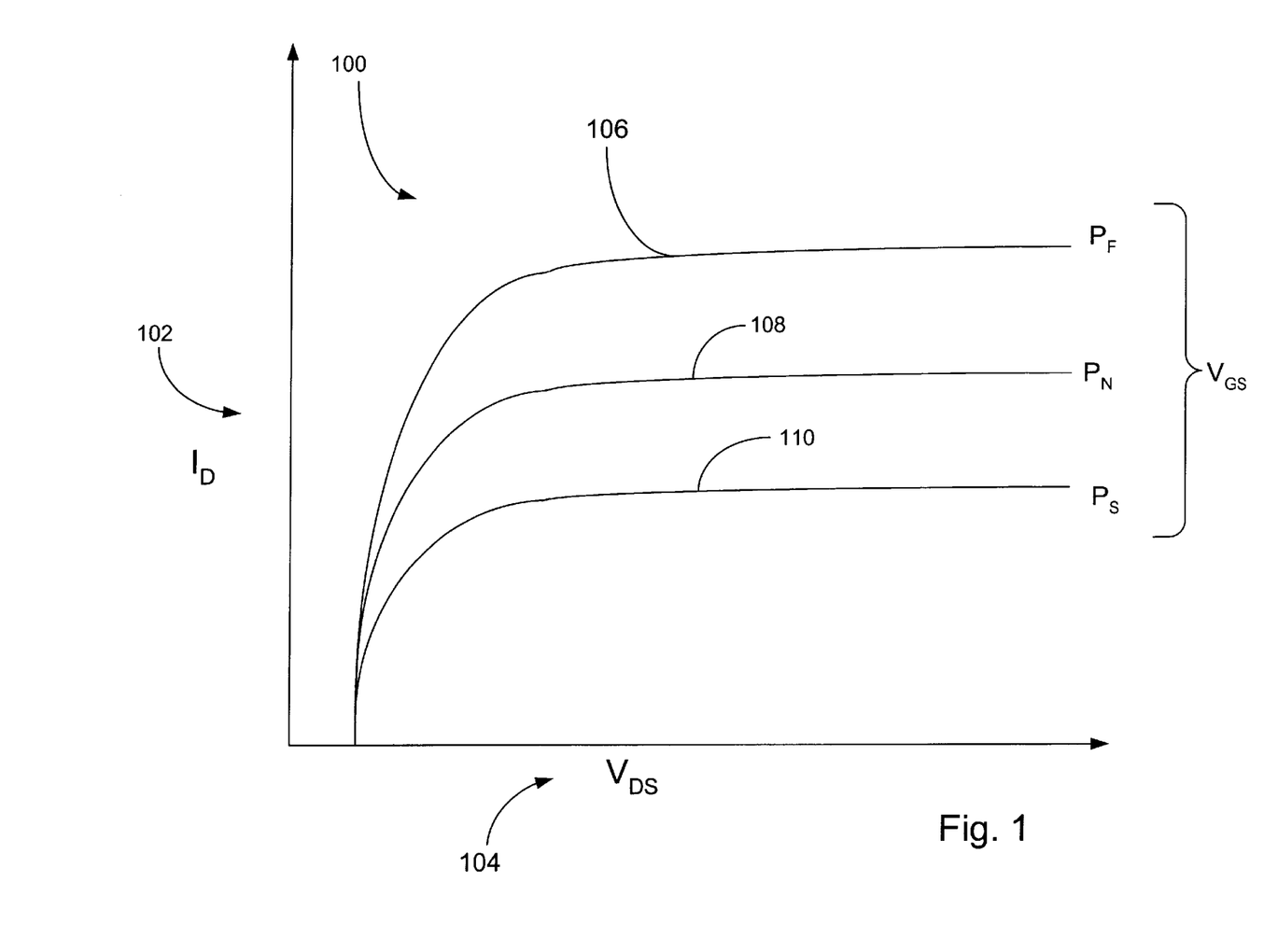
FIG. 1 illustrates output $V_{gs}$ plot over $I_d$ verses $V_{ds}$.

In reference to FIG. 1, a plot of $V_{gs}$ curves for the $I_d$ verses $V_{ds}$ is shown for an exemplary semiconductor device. As is known by those of ordinary skill in the art, the $V_{gs}$ output curves 100 for a semiconductor device, for example, a field effect transistor (FET), behave as shown with respect to $I_d$ 102 and $V_{ds}$ 104. As is further understood, the output current $I_d$ 102 for devices made by different semiconductor manufacturing process runs may vary between a plot $P_F$ 106 and a plot $P_S$ 110 due to unwanted variations in process parameters. Plot $P_N$ 108 represents nominal device behavior and output $V_{gs}$ for an average or desired device as would result from nominal process. Plot $P_F$ 106 represents the behavior of a fast device as results from a fast process. Plot $P_s$ 110 represents the behavior of a slow device as results from a slow process. As can be understood, the current output $I_d$ of a fast device, shown by plot 106, is greater than the current output $I_d$ of a slow device, shown by plot 110. U.S. Pat. No. 5,939,933 entitled Intentionally Mismatched Mirror Process Inverse Current Source issued on Aug. 17, 1999, which is incorporated herein in its entirety, provides additional information regarding the effects of process parameter variation on the behavior of semiconductor devices. It is contemplated that the present invention may be configured with various types of devices including but not limited to one or more, PFET, NFET, MOSFET, BJT or any transistor device, or any combination thereof.

Moreover, when the operating temperature of the device increases, the $V_{gs}$ curves shown in FIG. 1 likewise change to assume lower $I_d$ values. The following equation defines this relationship:

$$Id=k(Vgs-Vt)^2$$

$$k=\tfrac{1}{2}\mu Cox(w\!/\!l)$$

Where k is the k factor that changes with temperature.

Figure 2:
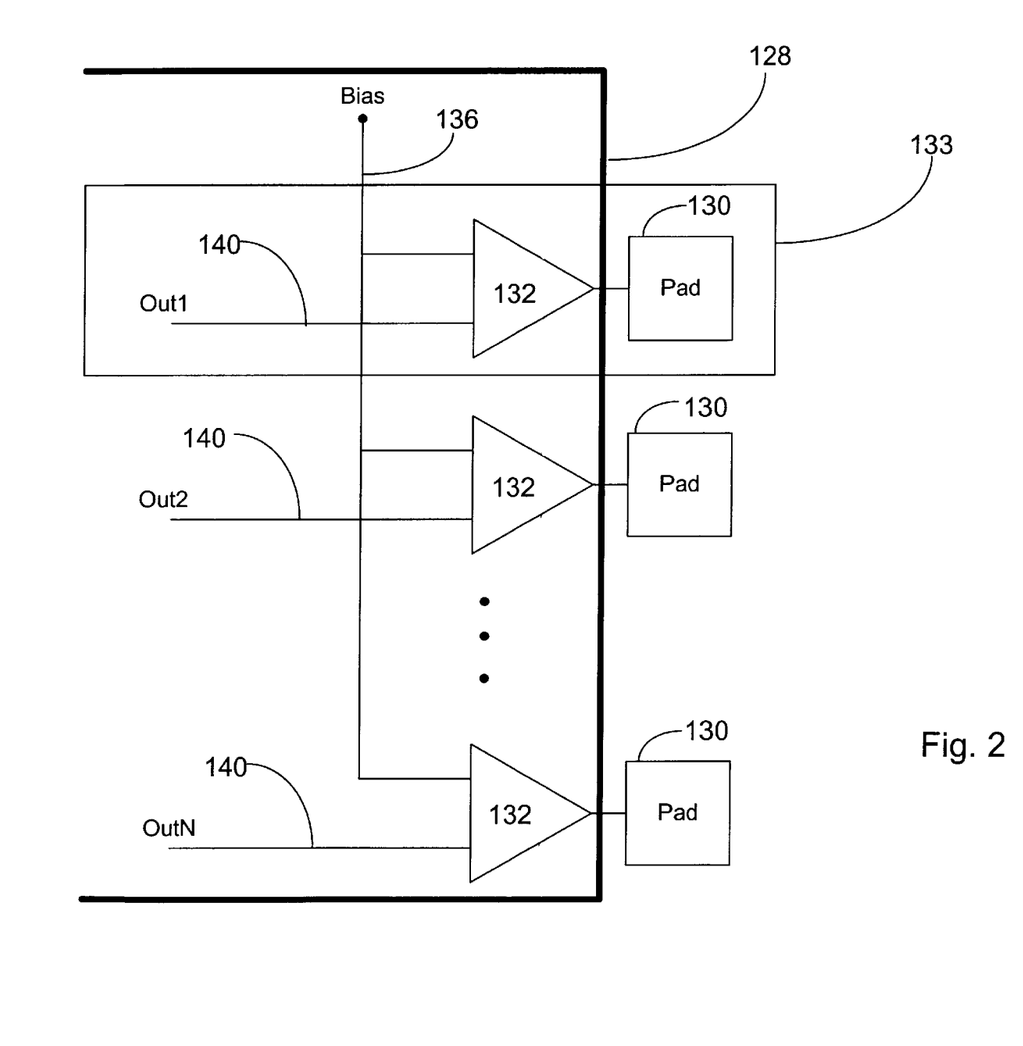
FIG. 2 illustrates a block diagram of one example environment of the present invention.

From FIG. 1 it is understood that current $I_d$ undesirably varies in semiconductor devices manufactured during different manufacturing process runs. This is true even when such devices are similarly located and similarly oriented on an integrated circuit, if that integrated circuit was manufactured during different process runs. FIG. 2 illustrates an example environment for the method and apparatus for compensation of the present invention. As is commonly configured, an integrated circuit 128 or chip has numerous output pads 130 that are external to the chip. The pads 130 are shown extended beyond the boundaries of the chip 128, although it is fully contemplated that the pads could be configured in a non-exposed state, such as in conjunction with system-on-a-chip designs. Driving each output pad 130 is output driver circuitry 132. The driver circuit 132 receives a bias signal 136 and a signal on a data output line 140. In one configuration, the driver circuit 132 is associated with each output pad 130. It is contemplated that combined module 133 drive or power high speed data transmission.

The driver circuit 132 enables proper data transfer over a transmission line. The signals on outputs 140 are generated internal to the integrated circuit contained on chip 128 and will vary greatly by application. The bias signal 136 properly biases the driver circuit 132. In systems of the prior art, the bias signal 136 undesirably varies due to variation in device behavior as a result of variation in process parameters. In one configuration, the present invention advantageously supplies the bias signal 136 to the driver.

Figure 3:
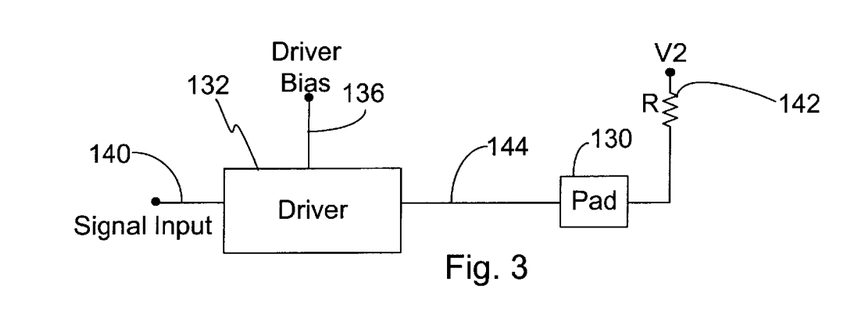
FIG. 3 illustrates a block diagram of an exemplary configuration of a contact or pad with associated driver.

FIG. 3 illustrates a block diagram of a pad driver 132 and pad 130 as is found in or in conjunction with an integrated circuit. The output of a data circuit is the signal input 140 to the driver circuit 132. The driver circuit receives a bias voltage 136 to facilitate proper operation. The driver output 144 connects to the pad 130 to facilitate transmission of the output signal 140 to a transmission line or some other medium. A resistor 142 in serial connection to a voltage V2 connects to the pad 136 to serve as a voltage divider network and transmission line impedance matching.

Figure 4:
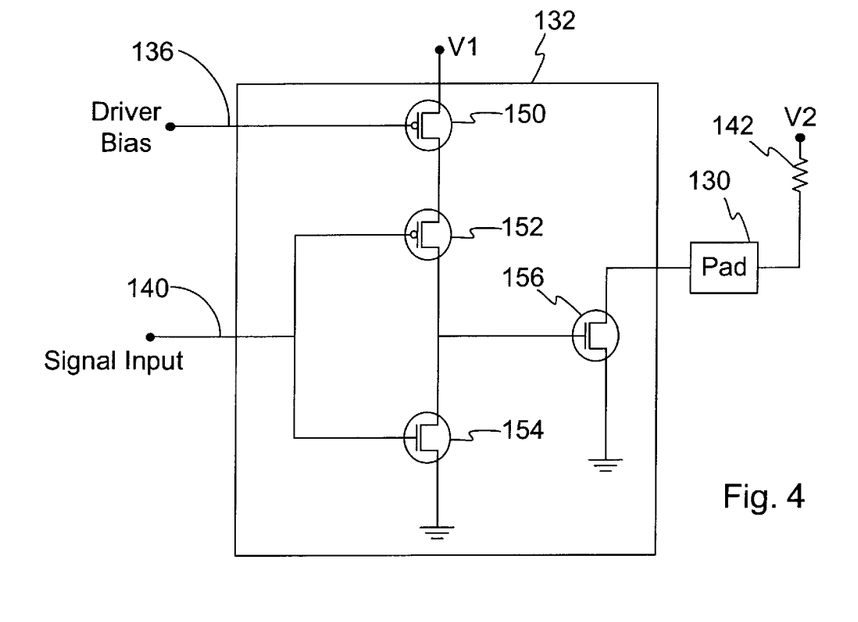
FIG. 4 illustrates an example embodiment of a driver as illustrated in FIG. 3.

FIG. 4 illustrates an example embodiment of the pad driver 132 in greater detail. In FIG. 4 and in all the figures discussed herein, like elements are labeled with like reference numerals. The driver circuits 132 is described herein for purposes of understanding. As shown, the signal input 140 of the driver (data output of the integrated circuit) connects to the gate terminals of a transistor 152 and a transistor 154. The drain of the transistor 152 connects to the source of the transistor 154, both of which are commonly coupled to a gate of a transistor 156. The transistor 156 includes a drain coupled to ground and source coupled to the pad 130. The transistor 152 has source connected to the drain of a transistor 150. The transistor 150 couples to a driver bias voltage 136 via its gate and a reference voltage V1 at its source terminal. The voltage at the pad 130 is defined by the following equation:

$$Vpad \cong V2\left(\frac{Z_{T156}}{Z_{T156} + R_{142}}\right)$$

In operation, when the signal input 140 is in a high state, the transistor 152 (PFET) is off and the transistor 154 is on or conducting. As a result the signal at the gate of transistor 156 is low (transistor 154 acting as a short to ground) causing transistor 156 to not conduct from source to drain. Transistor 156, being off, causes the pad voltage to assume voltage V2. Voltage V2 can be set according to the desire voltage level output. In one embodiment the voltage V2 is approximately 3.3 volts.

Conversely, if the input is low, transistor 154 is off and transistor 152 is on and conducting. With transistor 152 on, the current through transistor 150 is presented to the gate of transistor 156. As the gate of transistor 156 charges, it slow begins to conduct or turn on. As it begins conducting source to drain, the pad voltage, i.e., the voltage seen at the pad 130, begins dropping until it reaches a low state as was presented at the input 140. This occurs as a result of current flow through transistor 156 to ground thereby causing the signal at the pad 130 to be low.

Undesirably, driver bias signal 136 varies over process. It is easily understood, based on the above description, why driver bias 136 in FIG. 4 should desirably be precisely controlled. Driver bias controls the rate of voltage change at the gate of transistor 156 when the input to the driver changes. Because the level of driver bias 136 controls the rate of change in the channel between the source and drain of transistor 156, it also controls the slew rate, which is to say the rate of change of the output. If driver bias is large, the channel in transistor 156 has the potential to change more rapidly, thereby providing a greater slew rate. Hence, control over driver bias signal 136 also provides control over the slew rate of the output.

It is fully contemplated that the teachings of the present invention, described below in the configuration of a bias voltage supply for a pad driver, could find applicability in numerous other systems and configurations. For example, it is desirable to maintain an appropriate bias in other circuits including but not limited to any system utilized to translate a controlled slew rate into a controlled delay, such as in a controlled precision delay cell, which can serve as a low cost alternative to a phase locked loop.

Figure 5:
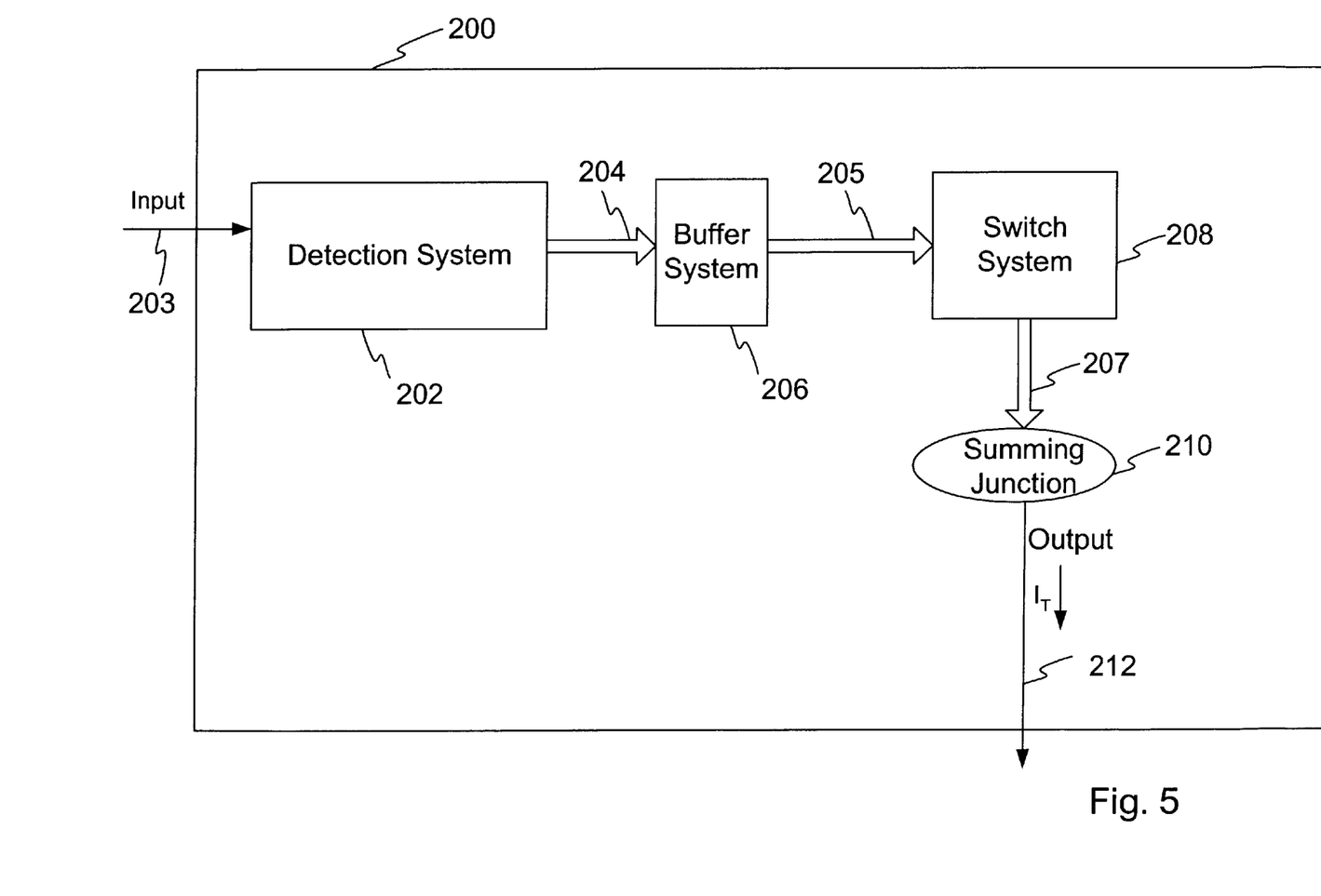
FIG. 5 illustrates a block diagram of one example embodiment of the present invention.

FIG. 5 illustrates a block diagram of one example configuration of the present invention. As shown, an automatic compensation system 200, configured to compensate for the variation in process parameters that occurs in semiconductor processing, comprises a detection system 202 with input 203, coupling lines 204, 205, and 207, a buffer 206, a switch system 208 and a summing junction 210. The summing junction output 212 comprises a total current $I_T$.

In one embodiment the detection system 202 detects the behavior of the devices as is determined by and may vary from process to process. The detection system thus provides an output on one or more lines 204 regarding the behavior of the device in terms of whether the process created fast devices or slow devices. It is contemplated that the output lines 204 may comprise one or a plurality of lines. In one exemplary configuration, the output configuration comprises a plurality of lines, the signals of which describe device behavior. In one configuration, the device behavior comprises the current $I_d$ through the device for a particular voltage $V_{ds}$ and $V_{gs}$. The output of the detection system may comprise an analog signal or a digital signal.

Other embodiments include a buffer system 202, shown for purposes of discussion, to convert the analog output of the detection circuit 202 to a digital format for use by the switching system. In one embodiment, the buffer system 206 converts the output level of the detection system to a different and desired voltage or current level. In such a configuration, the buffer system 206 converts the detection system output to a digital logic level of desired magnitude.

The switch system receives the one or more signals from the buffer 206 on coupling 205. The switch system is configured to selectively provide input to summing junction 210 based on the input from detection system 202. It is contemplated that in one embodiment the signals from detection system 202 and buffers 206 control one or more switches or signal sources within the switching system 208. While the term switch is used herein for purposes of understanding, the signal provided by the switching system 208 to the summing junction 210 may come from any variety of sources including but not limited to voltage sources, current sources, amplifiers, transistors, digital switches and other such devices.

In embodiments having couplings 204, 205, 207 with multiple lines, the summing junction 210 combines the signals on lines 207 and provides the total signal on output 212. In one embodiment the output is current $I_T$.

This is but one embodiment and example configuration of the automatic compensation system as contemplated herein. It is full understood that the compensation system may assume a variety of other configuration. In one configuration the detection system 202 generates a single output representative of the desired input on lines 203 thereby eliminating buffers 206 and switching system 208. Those of ordinary skill in the art will realize that other configurations of the present invention are possible without departing from the scope of the invention as broadly described herein.

Figure 6:
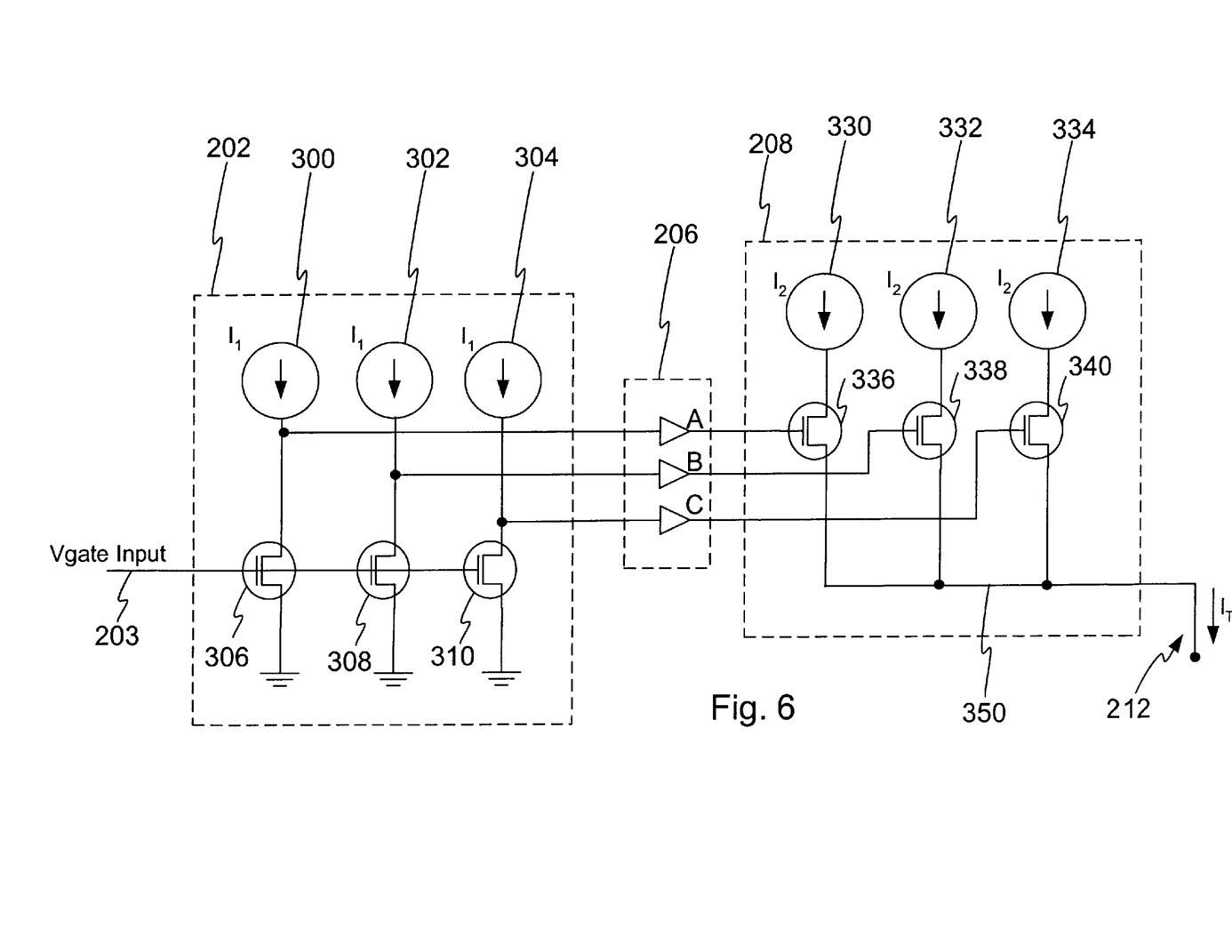
FIG. 6 illustrates an exemplary implementation example of one embodiment of the present invention.

FIG. 6 illustrates an exemplary implementation example of the system of FIG. 5. The detection system 202, the buffer system 206, and the switching system 208 are now discussed in terms of the implementation example shown. It should be noted that the system shown in FIG. 6 is but one possible implementation example. The present invention is not limited to this particular detailed implementation and it is provided for purposes of enablement and understanding.

Detection Subsystem

The detection system 202 comprises a first current source 300, a second current source 302, and a third current source 304. The output of each current source 300, 302, 304 connects to the source terminal of a first, second and third transistor 306, 308, 310 respectively as shown. An input having bias voltage connects to the gate of the first, second and third transistor 306, 308, 310. The driver bias Vgate on input 203 is a signal for which precision is required. Three outputs from the detection system 202 connect to the source terminal of each of the first, second and third transistors 306, 308, 310. The drain terminal of each of the first, second and third transistors 306, 308, 310 couples to ground as shown.

The first, second and third transistors 306, 308, 310 are generally identical and similarly oriented. The primary difference in configuration is that the transistors are configured such that for conditions of a nominal process the Vgate 203 signal will cause two of the three transistors 306, 308, 310 into saturation. Based on this configuration, it follows that for a fast process, only one of the three transistors 306, 308, 310 is in saturation. Conversely, for a slow process, three of the three transistors 306, 308, 310 are in saturation. Further operation of the detection system is described below in conjunction with the other subsystems.

Buffer Subsystem

The buffer subsystem 206 comprises a buffer in serial connection in each connection between the detection subsystem 202 and the switch subsystem 208. In this embodiment the buffer acts as one-bit analog to digital converter. Operation of the detection system is described below in conjunction with the other subsystems.

Figure 7:
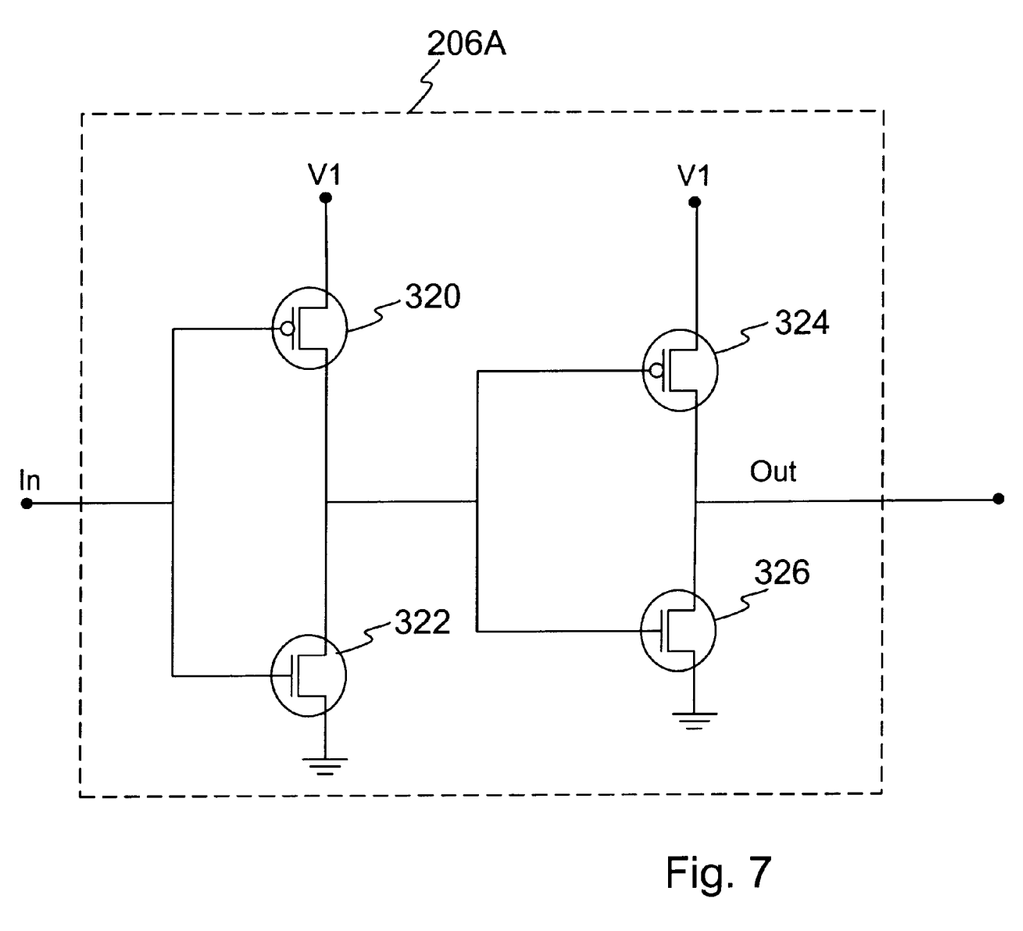
FIG. 7 illustrates an exemplary implementation example of one embodiment of the buffer subsystem.

FIG. 7 illustrates one example configuration of a buffer circuit that is well suited for use with the present invention. The buffer 206A shown provides a high output when the input exceeds the trigger voltage determined by the transistors 320, 322, 324, 326. As shown, transistors 320 and 324 are PFET devices. The buffer 318 provides a low output when the input signal does not exceed a trigger voltage for the transistors 320, 322, 324, 326. The configuration and operation of the buffer embodied in FIG. 7 are not described in greater detail herein as it is commonly understood by those of ordinary skill in the art.

Switch System

Returning to FIG. 6, the switch system 208 comprises a fourth current source 330, a fifth current source 332, and a sixth current source 334. The output of each current source 330, 332, 334 connects to the source terminal of fourth, fifth and sixth transistors 336, 338, 340 respectively as shown. An input comprising the buffer 206 output connects to the gate terminal of the fourth, fifth and sixth transistors 336, 338, 340. Three outputs from the detection system 202 connect to the source terminal of each of the fourth, fifth and sixth transistors 336, 338, 340. The drain terminal of each of the fourth, fifth and sixth transistors 336, 338, 340 lid couples to a summing node 350. The switch subsystem includes an output terminal 212. Operation of the detection system is described below in conjunction with the other subsystems.

Operation of Automatic Compensation System

Operation of the automatic compensation system accounts for variation in the voltage Vgate at input 203 as a result of process variation that occurs during manufacture of the device. As a result, the voltage Vgate will vary from process to manufacturing process. In a system having numerous pads, in the hundreds for example, each of which requires a voltage to drive the pad as shown in FIG. 2, variation in Vgate is undesirable as such variation can control the slew rate. While use of a voltage Vgate to properly bias a driver circuit is the example implementation shown and described herein, it should be understood that the compensation system described herein can be effectively utilized to overcome the variation in device behavior in numerous other implementations and configurations.

Turning now to example methods of operation, the discussion is provided in three exemplary states of device behavior. During the manufacturing process, all identically oriented devices behave similarly and may fall into one of three different classes: Fast, Nominal, or Slow. For the same drain current, a fast process creates devices that require a greater gate voltage to enter saturation as compared to a nominal process. For the same drain current, a slow process creates devices that enter saturation at a lower gate voltage as compared to nominal process. Operation of the system of FIG. 6 is now describe at each of three different processes, Fast, Nominal, Slow. Of course the process characteristics may exhibit infinite variation between a fast process and a slow process, discussed below in greater detail.

Fast Process

Devices created by a fast process enter saturation at a higher gate voltage. Therefore, working from the understanding of the configuration of the devices described above, for a set Vgate at the gate terminal of transistors 306, 308, 310 only one of the three shown transistors will be in saturation. While any one of transistors 306, 308, 310 could be in saturation, for purposes of discussion, we will assume transistor 306 is in saturation thereby causing the voltage Vds for transistor 306 to increase sufficiently to trigger buffer 206A to a high state. Voltages below the trigger point of buffers 206 result in a low state output on the buffers, while voltage inputs to the buffers above the buffer trigger point result in a high state output on the buffer. In one embodiment the trigger point is about 1.5 volts. The buffer trigger point can vary depending on the desired configuration and system logic levels.

Upon buffer 206A being triggered to provide a high output, the gate terminal of transistor 336 receives a high signal thereby causing transistor 336 to conduct from source to drain supplied by current source 330. In this scenario devices 338, 340 are off. Current flow from sources 330, 332, 334 can be varied or stepped as desired. The current summing junction 350 combines current flow from devices zon. 336, 338, 340. As is understood by those of ordinary skill in the art, the current $I_T$ may easily be transformed to a corresponding voltage $V_T$.

Nominal Process

In a similar environment, in a system created by a nominal process, two of the three transistors 306, 308, 310 will enter saturation. For purposes of discussion, the transistors 306, 308, are in saturation thereby causing buffers 206A and 206B to output a high state to the gate terminal transistor 336 and 338. High state at the gate terminal of transistor 336, 338 force conduction therein causing current 12 to flow via transistor 336, 338 to summing point 350 creating output current $I_{Tnom}$.

Slow Process

In a similar environment having similar Vgate on input 203, three transistors 306, 308, 310 are configured to enter saturation when presented with the input Vgate at input 203. For purposes of discussion, transistor 306, 308, and 310 are in saturation thereby causing buffers 206A, 206B, 206C to output a high state to the gate terminal of transistors 336, 338, 340. High state at the gate of transistor 336, 338, 340 force conduction therein causing current $I_2$ to flow via transistor 336, 338, 340 to summing point 350 creating output current $I_T$.

Therefore, depending on the device behavior, determined by the process parameters, the devices 306, 308, 310 react to an input Vgate. To achieve a generally consistent operation over process variation, the number of devices 336, 338, 340 in saturation varies, thereby adjusting the amount of current on output 212. Thus, in fast process compensation mode, only one device (transistor 336) is on, but it alone conducts an amount of current $I_{T1}$. In nominal process compensation mode, two devices are on, but each device conducts less current than the fast process device. However, since two devices are conducting, the total current at summing junction 350 is $I_{T2}$. In slow process compensation mode, three devices are on, but each device conducts less current than a fast or nominal process device. However, since three devices are conducting, the total current at summing junction 350 is $I_{T3}$. These currents $I_{T1}$, $I_{T2}$, and $I_{T3}$ are selected to properly operate the devices of the driver circuit, which were also created during the same semiconductor manufacturing process and hence react in a manner that is process dependent. Thus, the combined effects of the current $I_T$ and the device behavior in the driver circuit achieve uniform operation.

Figure 8:
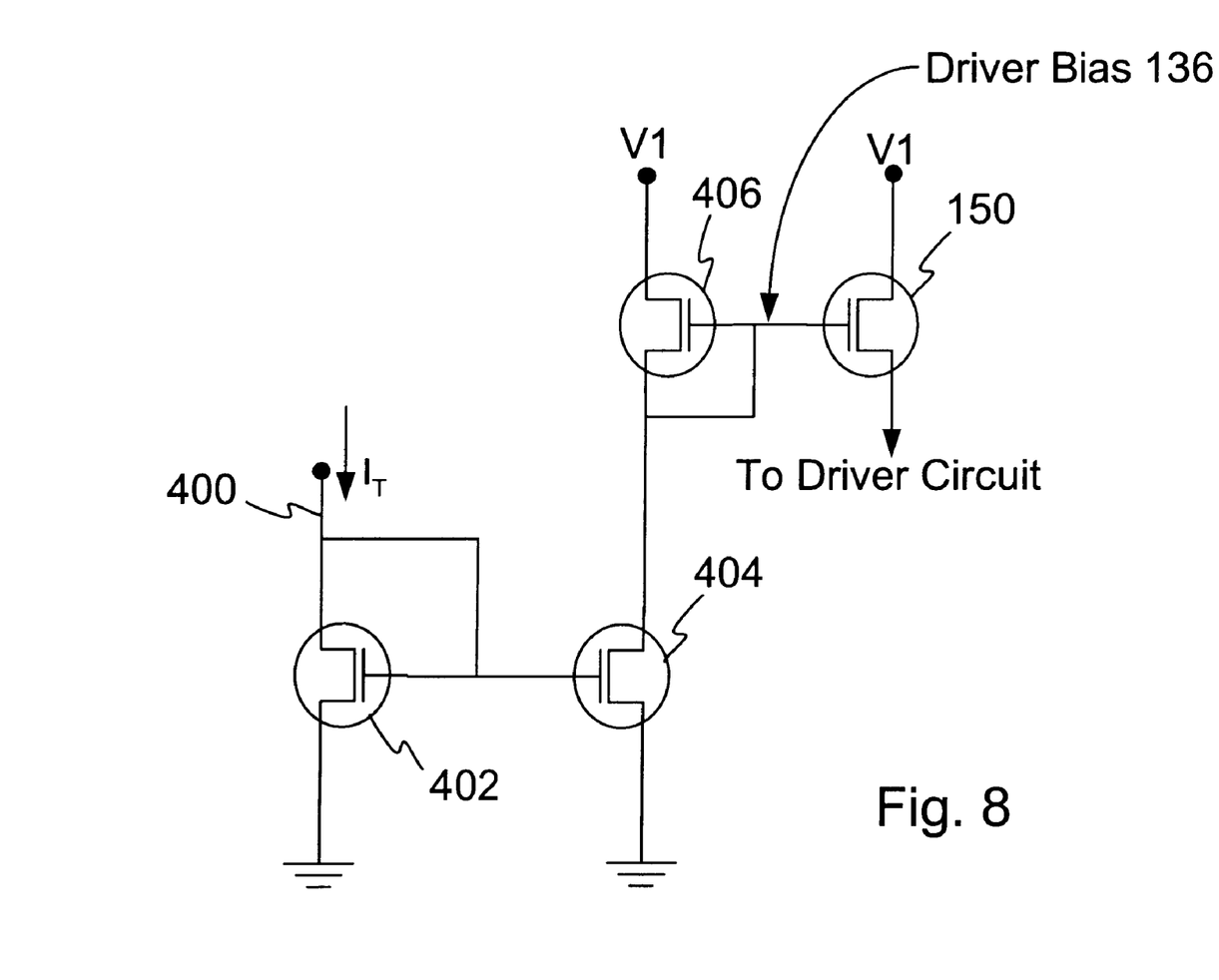
FIG. 8 illustrates an exemplary implementation example of an example circuit configured to receive the output $I_T$ of the implementation example of FIG. 6.

FIG. 8 illustrates one exemplary circuit that could be connected to the output $I_T$ of the compensation module shown in FIG. 6. FIG. 6 illustrates one embodiment of a compound current mirror configuration. The operation of current mirrors, being understood by those of ordinary skill in the art, is not described in detail herein. However, current $I_T$ received at input 400 is mirrored by transistors 402, 404, 406 to create driver bias at node 136. In this configuration the current mirror utilizes the compensated signal $I_T$ to bias the driver circuit of FIG. 4. This provides more uniform and predictable operation of the driver circuit which in turn provides controllable and predictable slew rates on the output. Absent such compensation, the slew rates will undesirably vary from output pad to output pad.

It should be noted that all the devices on the integrated circuit, being created in the same process will exhibit similar behavior variation. Accordingly, the devices in the drive circuit, or other circuits connected to the compensation, will likewise vary. Thus, variation in $I_T$ accounts for variation in the devices configured to receive $I_T$. Hence, as a device requires less voltage to turn on, the signal $I_T$ likewise goes down. In this manner, the slew rate can be controlled.

As an alternative configuration, each current mirror is configured to provide a factor of amplification or de-amplification to thereby provide greater control over the output of the current mirror pair. It is contemplated that the amplification factor is automatically adjusted to provide further levels of control.

Yet another advantage of providing the output current $I_T$ to a current mirror pair is the resulting reduction in componentry associated with each pad. For example on an integrated circuit having 100 pads, the output of the buffer 206 could be routed to each pad driver 130, but the switching circuit 208 would then have to be incorporated into each pad driver. This undesirably increases cost, size, and power consumption of the system. As a preferred alternative, the output of the switch subsystem $I_T$ is provided to a current mirror, at each pad. Hence, the current $I_T$ is mirrored at multiple locations on the integrated circuit.

Alternative Embodiments

Figure 9:
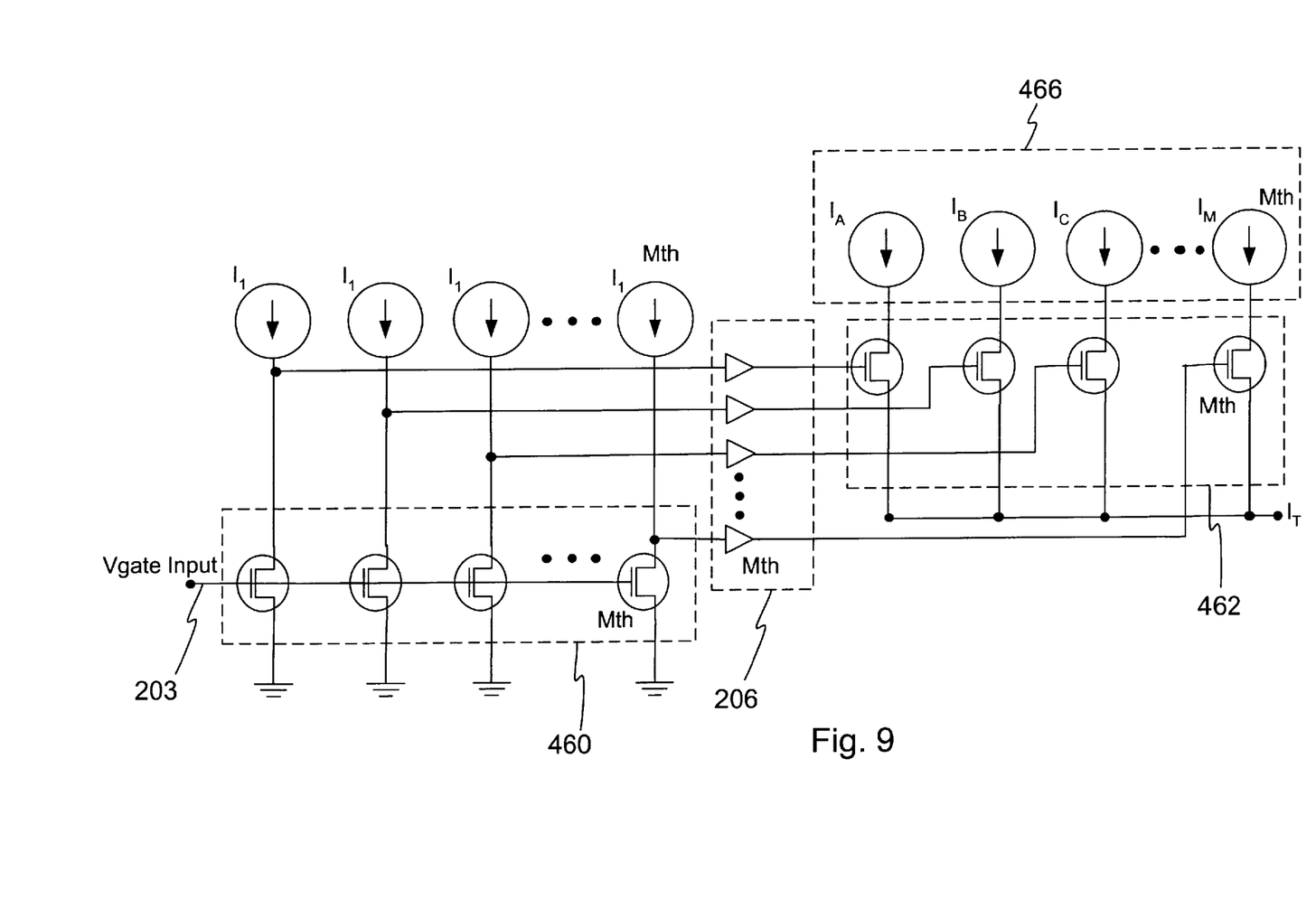
FIG. 9 illustrates an exemplary implementation example of an alternative embodiment having any number of levels of sensitivity in the detection subsystem and the switching subsystem.

While the example embodiment is shown and described herein with levels of granularity, i.e., three transistors in the detection subsystem, the principles of the present invention may be extended to include greater numbers of transistors. FIG. 9 illustrates an example embodiment of the present invention with M levels of granularity. As shown, the principles may be extended to any level of granularity or control desired. In one embodiment, there are nine levels of granularity. In such a configuration, each of the transistors 460 is configured to turn-on or saturate at a different voltage level. Thus, depending on the particular variation in the manufacturing process, differing numbers of transistors 460 are in saturation. This leads to a corresponding number of transistors (switches) 462 conducting controlled by the variation in the input 203 having voltage Vgate. As can be understood, the greater the number of transistors and buffers in the system, the smaller the degree of separation between each incremental step increase in $I_T$ thereby achieving greater granularity in output steps.

In a further variation of the present invention, the current sources 466 can be set to vary in output value. Hence, the values $I_A$, $I_B$, $I_C$ up to $I_M$ may be configured to provide non-equal values. Such an alternative configuration provides additional control over the stepwise change in $I_T$ that occurs as compensation for the manufacturing process variance or temperature variance. In a preferred embodiment, current $I_1$ is constant from current source 300, 302, 304 to current source 300, 302, 304, although it is contemplated that in alternative embodiments the output of these current sources could also vary thereby providing a greater level of control over the output current $I_T$.

Figure 10:
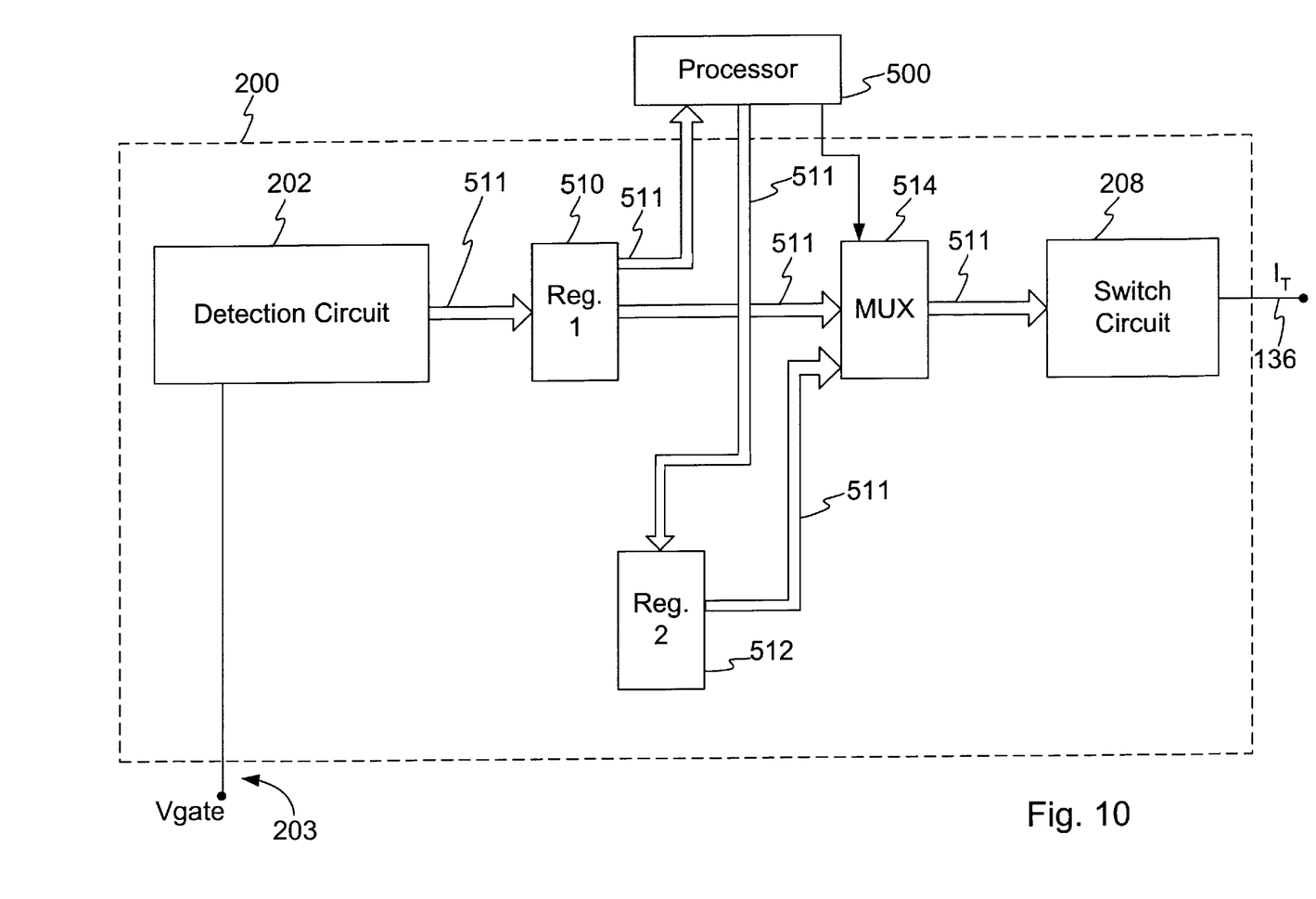
FIG. 10 illustrates a block diagram of an alternative embodiment of the present invention configured with a processor interface.

In a further variation or embodiment, the present invention is configured with a microprocessor or other intelligent interface configured to optionally utilize the output of the detection circuit or modify the detection circuit output. FIG. 10 illustrates a block diagram of an example embodiment of a processor controlled compensation system. As shown, a processor 500 communicates with a compensation system 200. The compensation system 200 receives the Vgate signal on input 203. The detection circuit provides input to a first register 510 via a coupling 511. In one embodiment the coupling lines 511 comprises multiple conductors in parallel configuration. It is contemplated that a parallel configured conductor connect to each detector transistor in the detection circuit 202. The first register 510 couples to the processor 500 and a multiplexer 514. The processor may be located external to the integrated circuit and access via an interface (not shown).

The processor 500 connects to a second register 512 and the multiplexer 514. The output of the multiplexer 514 couples to the switch circuit 208. The output of the switch circuit provides driver bias signal on output 136.

In operation, the detection circuit 202 receives Vgate signal on input 203 as an input signal and behaves in a manner described above. As is understood, the detection circuit may have any number of degrees of resolution and thus, the output of the detection circuitry 511 may be a parallel line having a corresponding number of conductors and associated control lines. The output of the detection circuitry 202 is stored in the first register 510. Thereafter, the first register 510 transfers its contents to the processor 500.

The processor analyzes the detection circuit output by comparing the number of lines that are in a high state to a known value comprising the number of desired high state lines. The known value comprising the number of desired high state lines may be stored on the processor or in memory accessible by the processor. Advantageously, the processor may be controlled via a processor interface (not shown) to thereby allow a user to control the number of lines that are desired to be in a high state. This can allow a user to adjust the slew rate of the circuitry connected to the pads during operation of the devices. Such compensation provides added controllability and can adjust for an otherwise malfunctioning device. Moreover, the processors can be programed to automatically and dynamically adjust to changes in operating parameters such as temperature.

As a result of the comparison between the output of the detection circuitry 202 and the desired number of high state lines, the processor may take varying actions. One such action comprises forwarding the detection circuit output to the switch circuit 208 which occurs when the comparison determines that the detection circuit output is the desired input for the switch circuit. In this situation the first register 510 outputs its contents to the multiplexer 514 and the processor 500 controls the multiplexer to forward the first register contents to the switch circuit 208.

Alternatively, the processor 500 may initiate a second course of action wherein the processor outputs a desired set of values to the second register 512. This occurs if the comparison determines that the output of the detection circuit is unsuitable for use. In this situation, the processor 500 outputs a replacement set of values to the second register 512. Thereafter, the processor controls the multiplexer 514 to forward the content from the second register 512 to the switch circuit 208 for processing in a manner described above for the switch circuit.

In another configuration the processor 500 operates without the support of the detection circuit 202 and the first register 510. The processor 500 stores the desired input into the switch circuit and operates in conjunction with the second register 512 and multiplexer 514 to provide the desired input to the switch circuit 208.

In yet another embodiment, the processor based system is enabled without the multiplexer 514. As such, the output of the first register 510 feeds into the processor, the processor performs a comparison, and outputs to the second register 512 a desired value. Thereafter, the second register 512 forwards its contents to the switch circuit 208.

It will be understood that the above described arrangements of apparatus and the method therefrom are merely illustrative applications of the principles of this invention and many other embodiments and modifications may be made without departing from the spirit and scope of the invention as defined in the claims.

I claim:

1. A compensation system configured to compensate for the signal variation in an input signal for which accuracy is preferred, the system comprising:
    signal detection circuitry configured to receive and analyze an input signal, said signal detection circuit further configured to output one or more signals indicative of the variation in device behavior, wherein the signal detection circuitry comprises two or more semiconductor devices, manufactured during the same semiconductor manufacturing process, and configured to enter saturation at different input voltages;
    one or more variable power sources; and
    control circuitry in communication with the signal detection circuit, the control circuitry configured to regulate output from the one or more variable power sources based on the one or more signals indicative of the variation in device behavior from the signal detection circuitry.

2. The system of claim 1, wherein at least one of the one or more variable power sources comprises a current source.

3. The system of claim 1, wherein the control circuitry comprises one or more semiconductor devices configured to facilitate signal output from the one or more power sources.

4. The system of claim 1, wherein the semiconductor devices in the signal detection circuitry comprise FET devices, each having a gate terminal connected to the input signal.

5. The system of claim 1, further including a summing junction configured to receive and combine the output of the one or more variable power sources.

6. A system for adjusting to the variation in control signal, wherein it is desirable that the control signal be at a level that facilitates desired operation of a circuit, wherein the level may adjust to compensate for variation in one or more semiconductor device behavior due to process variation or temperature variation, the system comprising:
    a detection system configured to receive a control signal and based on the magnitude of the control signal, generate one or more detection system output signals;
    a switching system having one or more switching devices, each switching device being controlled by one or more of the detection system output signals, wherein said detection system and the switching system operate to generate a compensation signal to compensate for the variation in one or more semiconductor device behavior to thereby account for variation in process or temperature; and
    a buffer intermediate the detection system and the switching system.

7. The system of claim 6, wherein the control signal comprises a semiconductor bias signal.

8. The system of claim 6, wherein the control signal controls the slew rate of an output driver.

9. The system of claim 6, wherein the switching system comprises at least one field effect transistor configured to enable current flow based on the detection system output signals.

10. The system of claim 6, further including a common node connecting and combining the output of the at least one field effect transistor.

11. The system of claim 6, wherein the switching system comprises a field effect transistor for each of the one or more detection system output signals.

12. An apparatus for controlling the slew rate of a pad driver, the apparatus comprising:
    means for generating a plurality of output signals, the number of output signals based on the granularity of the means for generating, the plurality of output signals having values based on an input to the means for generating and the input having value based on the behavior of semiconductor devices;
    means for creating a replacement input signal based on the number of plurality of signals from the means for generating that are above a predetermined value; and
    means for performing a one bit analog to digital conversion located intermediate the means for generating and means for creating.

13. The apparatus of claim 12, wherein the behavior of semiconductor devices varies based on the particular processing run with which the semiconductor device was manufactured.

14. The apparatus of claim 12, wherein the predetermined value comprises the turn-on value for a transistor.

15. A compensation system configured to compensate for the signal variation in an input signal for which accuracy is preferred, the system comprising:

signal detection circuitry configured to receive and analyze an input signal, said signal detection circuit further configured to output one or more signals indicative of the variation in device behavior;

one or more variable power sources, wherein at least one of the one or more power sources comprises a current source; and control circuitry in communication with the signal detection circuit, the control circuitry configured to regulate output from the one or more variable power sources based on the one or more signals indicative of the variation in device behavior from the signal detection circuitry.

16. The system of claim 15, wherein the control circuitry comprises one or more semiconductor devices configured to facilitate signal output from the one or more variable power sources.

17. The system of claim 16, wherein the semiconductor devices in the control circuitry comprise FET devices, each having a gate terminal connected to the input signal.

18. The system of claim 15, further including a summing junction configured to receive and combine the output of the one or more variable power sources.

* * * * *